(12) United States Patent
Lin et al.

(10) Patent No.: US 9,829,189 B2
(45) Date of Patent: Nov. 28, 2017

(54) LIGHT EMITTING DIODE MODULE AND DISPLAY DEVICE

(71) Applicant: SHENZHEN TCL NEW TECHNOLOGY CO., LTD, Shenzhen, Guangdong (CN)

(72) Inventors: Jie Lin, Guangdong (CN); Kewen Qiang, Guangdong (CN); Xiehe Zhong, Guangdong (CN)

(73) Assignee: SHENZHEN TCL NEW TECHNOLOGY CO., LTD, Shenzhen (CN)

( * ) Notice: Subject to any disclaimer, the term of this patent is extended or adjusted under 35 U.S.C. 154(b) by 0 days.

(21) Appl. No.: 15/303,522

(22) PCT Filed: Dec. 13, 2014

(86) PCT No.: PCT/CN2014/093781
§ 371 (c)(1),
(2) Date: Oct. 11, 2016

(87) PCT Pub. No.: WO2016/037432
PCT Pub. Date: Mar. 17, 2016

(65) Prior Publication Data
US 2017/0030569 A1    Feb. 2, 2017

(30) Foreign Application Priority Data

Sep. 11, 2014 (CN) .................... 2014 2 0521162 U

(51) Int. Cl.
*F21V 29/70* (2015.01)
*F21V 23/00* (2015.01)
(Continued)

(52) U.S. Cl.
CPC .......... *F21V 29/70* (2015.01); *F21V 19/0025* (2013.01); *F21V 23/00* (2013.01); *F21V 29/80* (2015.01); *F21Y 2115/10* (2016.08)

(58) Field of Classification Search
CPC .......... F21V 29/70; F21V 29/80; F21V 23/00; F21V 19/0025; F21V 2115/10
(Continued)

(56) References Cited

U.S. PATENT DOCUMENTS

| | | | | |
|---|---|---|---|---|
| 8,500,306 | B2 * | 8/2013 | Yoo | ...................... H05K 1/0206 362/249.02 |
| 2006/0274528 | A1 * | 12/2006 | Chou | ........................ F21K 9/00 362/294 |

(Continued)

FOREIGN PATENT DOCUMENTS

CN        2783126 Y        5/2006

OTHER PUBLICATIONS

Translation of CN2783126.*
International Search Report of PCT Patent Application No. PCT/CN2014/093781 dated Aug. 20, 2015.

*Primary Examiner* — Laura Tso

(57) ABSTRACT

The present disclosure provides a LED module. The LED module includes a LED lamp, a heat radiator, and a PCB. The LED lamp includes a LED main body, and a heat conducting block and a pin configured to the main body. The heat conducting block is mounted on the bottom surface of the LED main body towards the PCB. The pin has a free end passing through the PCB, and electrically connecting a bonding pad of the PCB. The heat radiator is caught between the heat conducting block and the PCB, and the heat conducting block resists against the heat radiator. A display device is also provided. The heat introduced by the LED lamp can directly dissipate from the heat conducting block (Continued)

to the heat radiator, thus enhancing the heat dissipation of the LED lamp.

20 Claims, 2 Drawing Sheets

(51) Int. Cl.
*F21V 29/80* (2015.01)
*F21V 19/00* (2006.01)
*F21Y 115/10* (2016.01)

(58) Field of Classification Search
USPC .......... 362/97.1, 249.02, 218, 294, 612, 613
See application file for complete search history.

(56) References Cited

U.S. PATENT DOCUMENTS

| 2011/0170314 A1* | 7/2011 | Hsu | F21V 29/004 362/612 |
| 2012/0069569 A1* | 3/2012 | Que | F21V 15/013 362/249.02 |

* cited by examiner

LIGHT EMITTING DIODE MODULE AND DISPLAY DEVICE

TECHNICAL FIELD

The present disclosure relates to light source technology, and particularly to a light emitting diode (LED) module and a display device using the LED module as backlight.

DESCRIPTION OF RELATED ART

Currently, more and more LEDS are applied in liquid crystal displays as backlight sources, the LED usually needs a large power, therefore the heat dissipation of the LED is more and more important. The LED is commonly welded on a printed circuit board (PCB), and then the PCB having the LED is configured to a heat radiator using heat-conductive adhesive. However, the heat-conductive adhesive commonly has a low heat conductivity coefficient, thus the heat dissipation of the LED is badly affected.

BRIEF SUMMARY OF THE DISCLOSURE

A main object of the present disclosure is to improve the heat dissipation of the LEDS.

To achieve the object, the present disclosure provides a LED module which includes a LED lamp, a heat radiator, and a PCB. The LED lamp includes a LED main body, and a heat conducting block and a pin configured on the main body. The heat conducting block is mounted on the bottom surface of the LED main body towards the PCB, the pin has a free end passing through the PCB, and electrically connecting a bonding pad of the PCB. The heat radiator is clamped between the heat conducting block and the PCB, and the heat conducting block resists against the heat radiator.

Preferably, the free end of each pin defines a latching portion, the PCB includes a PCB main body parallel to the bottom surface of the LED main body, the bonding pad of the PCB is defined on a surface of the PCB main body opposite to the LED main body, the latching portion latches the bonding pad of the PCB, allowing the pin electrically connecting the PCB.

Preferably, the distance between the latching portion of the pin and the surface of the heat conducting block contacted the heat radiator is no larger than the total thickness of the heat radiator and the PCB main body.

Preferably, the pin is perpendicularly configured on the bottom surface of the LED main body.

Preferably, the quantity of the pin is two, the heat conducting block is located between the two pins, the latching portion of each pin extends opposite from the other pin.

Preferably, the heat radiator defines a first hole for the pin passing through, the PCB main body of the PCB defines a second hole matching the first hole for the pin passing through, the second hole is adjacent to the bonding pad of the PCB, the pin passes through the first hole and the second hole in turn to electrically connect the bonding pad of the PCB.

Preferably, the heat radiator is a metal heat radiator, an insulating layer is defined on the outside surface of the pin corresponding to the first hole.

Preferably, the inside surface of the first hole is defined an insulating layer.

Preferably, the material of the heat conducting block is metal or ceramic.

Further, to achieve the object, the present disclosure also provides a display device which includes the LED module, the LED module is for backlight. The LED module includes a LED lamp, a heat radiator, and a PCB. The LED lamp includes a LED main body, and a heat conducting block and a pin configured on the main body. The heat conducting block is mounted on the bottom surface of the LED main body towards the PCB. The pin has a free end passing through the PCB, and electrically connecting a bonding pad of the PCB. The heat radiator is clamped between the heat conducting block and the PCB, and the heat conducting block resists against the heat radiator.

Preferably, the free end of each pin defines a latching portion, the PCB includes a PCB main body parallel to the bottom surface of the LED main body, the bonding pad of the PCB is defined on a surface of the PCB main body opposite to the LED main body, the latching portion latches the bonding pad of the PCB, allowing the pin electrically connecting the PCB.

Preferably, the distance between the latching portion of the pin and the surface of the heat conducting block contacted the heat radiator is no larger than the total thickness of the heat radiator and the PCB main body.

Preferably, the pin is perpendicularly configured on the bottom surface of the LED main body.

Preferably, the quantity of the pin is two, the heat conducting block is located between the two pins, the latching portion of each pin extends opposite from the other pin.

Preferably, the heat radiator defines a first hole for the pin passing through, the PCB main body of the PCB defines a second hole matching the first hole for the pin passing through, the second hole is adjacent to the bonding pad of the PCB, the pin passes through the first hole and the second hole in turn to electrically connect the bonding pad of the PCB.

Preferably, the heat radiator is a metal heat radiator, an insulating layer is defined on the outside surface of the pin corresponding to the first hole.

Preferably, the inside surface of the first hole is defined an insulating layer.

Preferably, the material of the heat conducting block is metal or ceramic.

The LED module of the present disclosure has the heat radiator clamped between the heat conducting block of the LED lamp and the PCB, the heat conducting block is directly assembled on the heat radiator, the heat introduced by the LED lamp can directly dissipate from the heat conducting block to the heat radiator, thus enhancing the heat dissipation of the LED lamp.

The implementations, functional features and advantages of the present disclosure will be further described with reference to embodiments thereof and the accompanying drawings.

DETAILED DESCRIPTION

It should be appreciate that, the embodiments described herein are only intended to illustrate but not to limit the present disclosure.

The present disclosure provides a LED module.

Figure 1:
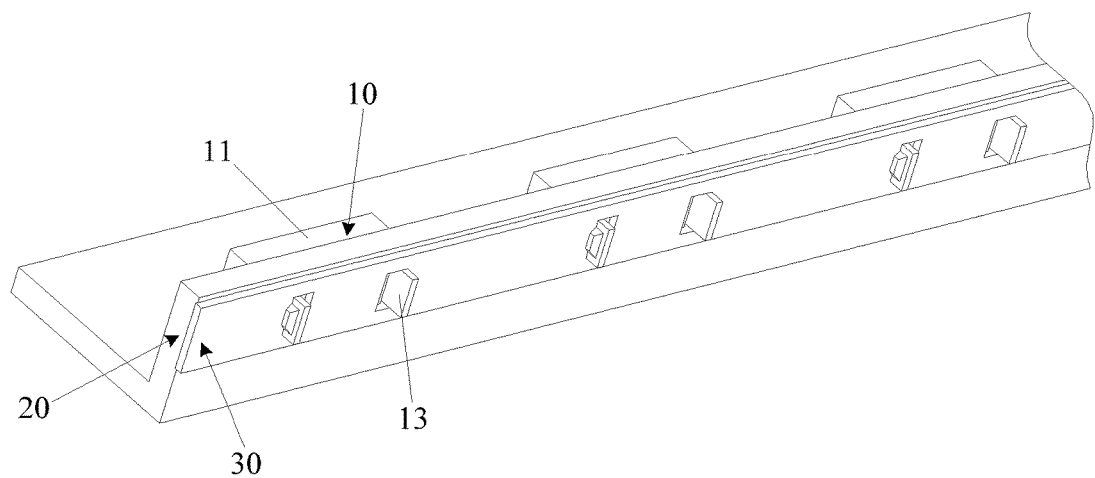
FIG. 1 is a schematic view of a LED module in an embodiment.
Figure 2:
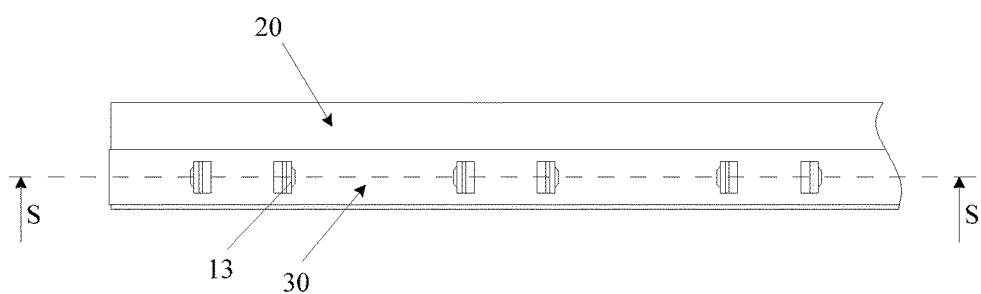
FIG. 2 is a front-on view of the LED module of FIG. 1.
Figure 3:
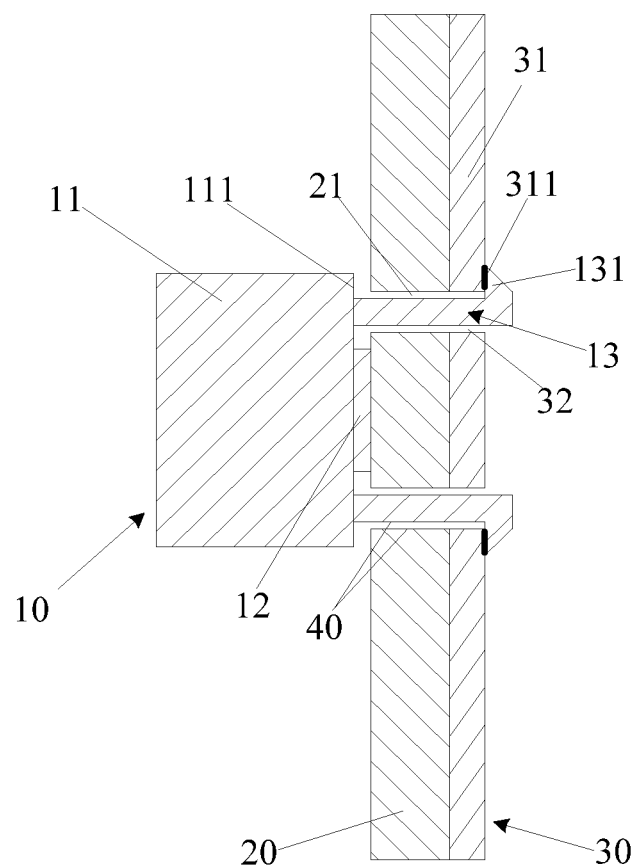
FIG. 3 is a partial cross-sectional view taken along line S-S of FIG. 2.

Referring to FIGS. 1-3, in an embodiment, the LED module includes a LED lamp 10, a heat radiator 20, and a PCB 30, the LED lamp 10 includes a LED main body 11, a heat conducting block 12 and a pin 13 configured on the main body 11, the heat conducting block 12 is mounted on the bottom surface 111 of the LED main body 11 towards the PCB 30, the pin 13 has a free end passing through the PCB 30, and electrically connected a bonding pad 311 of the PCB 30, the heat radiator 20 is clamped between the heat conducting block 12 and the PCB 30, the heat conducting block 12 resists against the heat radiator 20.

The traditional heat dissipation of the LED lamp is, the heat introduced by the LED lamp dissipating to the PCB first and second the heat-conductive adhesive, and then dissipating to the heat radiator, since the heat conductivity coefficient of the heat-conductive adhesive is far lower than that of the heat radiator, the heat-conductive adhesive greatly lows the heat dissipating efficiency. However, in the embodiment, the LED module has the heat radiator 20 clamped between the heat conducting block 12 of the LED lamp 10 and the PCB 30, the heat conducting block 12 is directly assembled on the heat radiator 20, the heat introduced by the LED lamp 10 can directly dissipate from the heat conducting block 12 to the heat radiator 20, thus greatly enhancing the heat dissipation of the LED lamp 10.

In the embodiment, the pin 13 of the LED lamp 10 is perpendicularly configured on the bottom surface 111 of the LED main body 11, the quantity of the pin 13 is two, the heat conducting block 12 is located between the two pins 13, the free end of each pin 13 defines a latching portion 131 which extends opposite from the other pin 13, the PCB 30 includes a PCB main body 31 parallel to the bottom surface 111 of the LED main body 11, the bonding pad 311 of the PCB 30 is defined on a surface of the PCB main body 31 opposite to the LED main body 11, the latching portion 131 latches the bonding pad 311 of the PCB 30, allow the pin 13 electrically connecting the PCB 30, and the distance between the latching portion 131 and the surface of the heat conducting block 12 contacted the heat radiator 20 is no larger than the total thickness of the heat radiator 20 and the PCB main body 31.

In the embodiment, the perpendicular distance between the latching portion 131 of the pin 13 and the heat conducting block 12 is equal to or slightly less than the total thickness of the heat radiator 20 and the PCB main body 31, when the latching portion 131 latches with the bonding pad 311 of the PCB 30 to electrically connect the pin 13 and the PCB 30, the heat radiator 20 can be securely clamped between the PCB 30 and the heat conducting block 12, the heat conducting block 12 tightly contacts the heat radiator 20, thus the heat introduced by the LED lamp 10 can effectively dissipates to the heat radiator 20 by the heat conducting block 12. Further, the pin 13 and the bonding pad 311 of the PCB 30 are latched to electrically connect with each other, allow the assembly of the LED module being more simple. In the embodiment, the material of the heat conducting block 12 may be metal or ceramic that possesses a high heat conductivity coefficient.

Further, the heat radiator 20 defines a first hole 21 for the pin 13 passing through, the PCB main body 31 of the PCB 30 defines a second hole 32 matching the first hole 21 for the pin 13 passing through, the second hole 32 is adjacent to the bonding pad 311 of the PCB 30, the pin 13 passes through the first hole 21 and the second hole 32 in turn to electrically connect the bonding pad 311 of the PCB 30. In the embodiment, the electrical connection of the pin 13 and the bonding pad 311 of the PCB 30 can be simply achieved by the latching of the latching portion 131 of the pin 13 to the bonding pad 311, which further simples the assembly of the LED module.

In the embodiment, the heat radiator 20 is a metal heat radiator 20. An insulating layer 40 is defined on the outside surface of the pin 13 corresponding to the first hole 21, thus avoiding the two pins 13 contacting the heat radiator 20 at the same time which may occur a short circuit of the LED lamp.

It is understood that, in the embodiment, the inside surface of the first hole 21 can also be defined an insulating layer 40 to avoid a short circuit of the LED lamp.

The present disclosure also provides a display device.

In an embodiment, the display device includes the LED module, the LED module is for backlight.

What described above are only preferred embodiments of the present disclosure but are not intended to limit the scope of the present disclosure. Accordingly, any equivalent structural or process flow modifications that are made on basis of the specification and the attached drawings or any direct or indirect applications in other technical fields shall also fall within the scope of the present disclosure.

What is claimed is:

1. A LED module, comprising:
    a LED lamp, a heat radiator, and a PCB, the LED lamp comprising a LED main body, and a heat conducting block and a pin configured on the main body, the heat conducting block being mounted on the bottom surface of the LED main body towards the PCB, the pin having a free end passing through the PCB, and electrically connecting a bonding pad of the PCB, the heat radiator being clamped between the heat conducting block and the PCB, the heat conducting block resisting against the heat radiator.

2. The LED module according to claim 1, wherein the free end of each pin defines a latching portion, the PCB comprises a PCB main body parallel to the bottom surface of the LED main body, the bonding pad of the PCB is defined on a surface of the PCB main body opposite to the LED main body, the latching portion latches the bonding pad of the PCB, allowing the pin electrically connecting the PCB.

3. The LED module according to claim 2, wherein the distance between the latching portion of the pin and the surface of the heat conducting block contacted the heat radiator is no larger than the total thickness of the heat radiator and the PCB main body.

4. The LED module according to claim 2, wherein the pin is perpendicularly configured on the bottom surface of the LED main body.

5. The LED module according to claim 4, wherein the quantity of the pin is two, the heat conducting block is located between the two pins, the latching portion of each pin extends opposite from the other pin.

6. The LED module according to claim 2, wherein the heat radiator defines a first hole for the pin passing through, the PCB main body of the PCB defines a second hole matching the first hole for the pin passing through, the second hole is adjacent to the bonding pad of the PCB, the pin passes through the first hole and the second hole in turn to electrically connect the bonding pad of the PCB.

7. The LED module according to claim 6, wherein the heat radiator is a metal heat radiator, an insulating layer is defined on the outside surface of the pin corresponding to the first hole.

8. The LED module according to claim 6, wherein the inside surface of the first hole is defined an insulating layer.

9. The LED module according to claim 7, wherein the inside surface of the first hole is defined an insulating layer.

10. The LED module according to claim 1, wherein the material of the heat conducting block is metal or ceramic.

11. A display device, comprising:
a LED module for backlight, the LED module comprising a LED lamp, a heat radiator, and a PCB, the LED lamp comprising a LED main body, and a heat conducting block and a pin configured on the main body, the heat conducting block being mounted on the bottom surface of the LED main body towards the PCB, the pin having a free end passing through the PCB, and electrically connecting a bonding pad of the PCB, the heat radiator being clamped between the heat conducting block and the PCB, the heat conducting block resisting against the heat radiator.

12. The display device according to claim 11, wherein the free end of each pin defines a latching portion, the PCB comprises a PCB main body parallel to the bottom surface of the LED main body, the bonding pad of the PCB is defined on a surface of the PCB main body opposite to the LED main body, the latching portion latches the bonding pad of the PCB, allow the pin electrically connecting the PCB.

13. The display device according to claim 12, wherein the distance between the latching portion of the pin and the surface of the heat conducting block contacted the heat radiator is no larger than the total thickness of the heat radiator and the PCB main body.

14. The display device according to claim 12, wherein the pin is perpendicularly configured on the bottom surface of the LED main body.

15. The display device according to claim 14, wherein the quantity of the pin is two, the heat conducting block is located between the two pins, the latching portion of each pin extends opposite from the other pin.

16. The display device according to claim 12, wherein the heat radiator defines a first hole for the pin passing through, the PCB main body of the PCB defines a second hole matching the first hole for the pin passing through, the second hole is adjacent to the bonding pad of the PCB, the pin passes through the first hole and the second hole in turn to electrically connect the bonding pad of the PCB.

17. The display device according to claim 16, wherein the heat radiator is a metal heat radiator, an insulating layer is defined on the outside surface of the pin corresponding to the first hole.

18. The display device according to claim 16, wherein the inside surface of the first hole is defined an insulating layer.

19. The display device according to claim 17, wherein the inside surface of the first hole is defined an insulating layer.

20. The display device according to claim 11, wherein the material of the heat conducting block is metal or ceramic.

* * * * *